(12) United States Patent
Shinoda

(10) Patent No.: US 8,208,126 B2
(45) Date of Patent: Jun. 26, 2012

(54) EXPOSURE APPARATUS AND DEVICE FABRICATION METHOD

(75) Inventor: Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 682 days.

(21) Appl. No.: 12/100,034

(22) Filed: Apr. 9, 2008

(65) Prior Publication Data

US 2009/0002673 A1   Jan. 1, 2009

(30) Foreign Application Priority Data

Apr. 20, 2007   (JP) ................. 2007-112290

(51) Int. Cl.
G03B 27/32 (2006.01)
G03B 27/42 (2006.01)
G03B 27/54 (2006.01)
G03B 27/72 (2006.01)
G03B 27/74 (2006.01)

(52) U.S. Cl. ............... 355/71; 355/53; 355/67; 355/68; 355/77

(58) Field of Classification Search ............ 250/201.1, 250/205, 225, 492.2; 355/35, 53, 67–69, 355/71, 77; 356/364–365; 359/352, 386

See application file for complete search history.

(56) References Cited

U.S. PATENT DOCUMENTS

| 2003/0095580 A1* | 5/2003 | Govorkov et al. | 372/57 |
| 2005/0270608 A1* | 12/2005 | Shiozawa et al. | 359/15 |
| 2007/0046921 A1 | 3/2007 | Takahashi | |
| 2008/0246933 A1* | 10/2008 | Uchikawa | 355/71 |

FOREIGN PATENT DOCUMENTS

| JP | 09-266159 A | 10/1997 |
| JP | 2001-284236 A | 10/2001 |
| JP | 2006-019702 A | 1/2006 |
| JP | 2007-035671 A | 2/2007 |
| WO | 02052624 A1 | 7/2002 |
| WO | WO 2005078774 A1 * | 8/2005 |

* cited by examiner

Primary Examiner — Hung Henry Nguyen
Assistant Examiner — Colin Kreutzer
(74) Attorney, Agent, or Firm — Canon U.S.A., Inc. IP Division

(57) ABSTRACT

The present invention provides an exposure apparatus comprising an illumination optical system configured to illuminate a reticle with a light beam from a light source, and a projection optical system configured to project a pattern of the reticle onto a substrate, the illumination optical system including a light amount adjusting unit configured to adjust an amount of the light beam, a polarization adjusting unit configured to adjust a polarization state of the light beam, and a beam splitter configured to split the incident light beam into two light beams, wherein the light amount adjusting unit, the polarization adjusting unit, and the beam splitter are set in an order from the light source side.

12 Claims, 11 Drawing Sheets

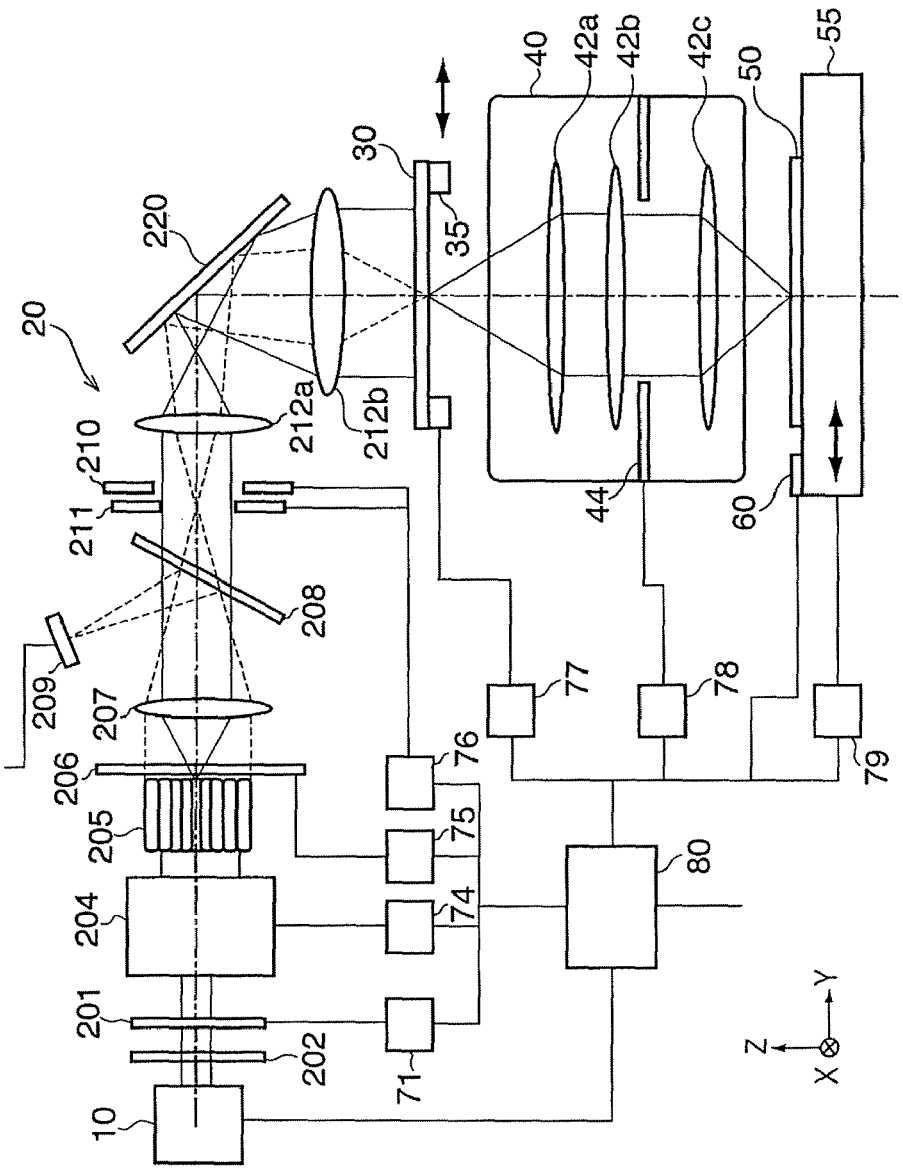
FIG. 11 -- PRIOR ART --

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus which transfers a pattern formed on a reticle (mask) onto a substrate such as a wafer has conventionally been employed to fabricate a semiconductor device using photolithography. A general projection exposure apparatus includes an illumination optical system which illuminates a reticle with a light beam from a light source, and a projection optical system which is interposed between the reticle and a wafer and projects the pattern of the reticle onto the wafer.

To obtain a uniform illumination region, an illumination optical system guides a light beam from a light source to an optical integrator such as a fly-eye lens to form a secondary source near the exit surface of the optical integrator, thereby Kohler-illuminating the reticle (or its conjugate plane) via a condenser lens.

High-quality exposure requires forming an optimal effective light source in accordance with the pattern of a reticle. The effective light source means the angular distribution of a light beam (exposure light) which enters a wafer. For example, when the light intensity distribution near the exit surface (secondary source) of an optical integrator is adjusted, it is possible to form desired effective light sources (e.g., normal illumination, annular illumination, quadrupole illumination, and dipole illumination). In addition, along with the recent increase in the NA of a projection optical system, it is becoming necessary to adjust the polarization state of exposure light. For this purpose, a polarization adjusting unit which adjusts the polarization state of exposure light is inserted in an illumination optical system.

High-quality exposure also requires high-accuracy control (dose control) to expose a photosensitive agent applied on a wafer with an appropriate dose. For this purpose, a light amount adjusting unit which adjusts the light amount is inserted in an illumination optical system of an exposure apparatus. The exposure apparatus detects the amount of a light beam reflected by a beam splitter inserted in the optical path of the illumination optical system and that of a light beam which enters a wafer, and controls the light amount adjusting unit based on the detection result. The light amount adjusting unit is formed from, for example, a plurality of neutral density filters, and can adjust the light amount by switching between them. See Japanese Patent Laid-Open No. 2001-284236 for details of this technique.

A light amount adjusting unit is placed at the subsequent of a polarization adjusting unit in an illumination optical system. To remove any light beam reflected by the neutral density filters from the optical path of the illumination optical system, the light amount adjusting unit is tilted with respect to an incident light beam. See Japanese Patent Laid-Open No. 2006-19702 for details of this technique. The amount of a light beam reflected by a beam splitter is detected by a first detector inserted in the illumination optical system or its vicinity. The amount of a light beam which enters a wafer is detected by a second detector arranged on the wafer surface (on a wafer stage which supports the wafer).

Unfortunately, a conventional exposure apparatus cannot perform high-accuracy dose control because a polarization adjusting unit, light amount adjusting unit, and beam splitter are set in an order from the light source side. The reason why the conventional exposure apparatus cannot perform high-accuracy dose control will be explained in detail below.

It is very difficult to set the reflectance (Rs) of a beam splitter with respect to an s-polarized light component equal to the reflectance (Rp) of the beam splitter with respect to a p-polarized light component. In other words, the transmittance (Ts) of the beam splitter with respect to an s-polarized light component does not become equal to the transmittance (Tp) of the beam splitter with respect to a p-polarized light component. The relationship among the Rs, Rp, Ts, and Tp values changes depending on the incident angle with respect to the beam splitter. For this reason, the angular distribution of a light beam which enters the beam splitter changes upon switching (to be referred to as "illumination mode switching" hereinafter) of the coherence factor (a) or shape of an effective light source. That is, the Rs, Rp, Ts, and Tp values of the beam splitter change for each illumination mode.

Let Is be the intensity of the s-polarized light component of a light beam which enters the beam splitter, and Ip be the intensity of its p-polarized light component. Then, an amount A of a light beam detected by the first detector and an amount B of a light beam detected by the second detector are given by:

$$A = (Is \times Rs) + (Ip \times Rp) \tag{1}$$

$$B = (Is \times Ts \times Cs) + (Ip \times Tp \times Cp) \tag{2}$$

where Cs is the efficiency of an optical system from the beam splitter to the second detector with respect to an s-polarized light component, and Cp is the efficiency of the optical system from the beam splitter to the second detector with respect to a p-polarized light component. Since the environment in the exposure apparatus is controlled so that the transmittance and reflectance of the optical system are always kept constant, the Rs, Rp, Ts, Tp, Cs, and Cp values are always kept constant for each illumination mode.

High-accuracy dose control requires stabilizing the ratio between the light amount A detected by the first detector and the light amount B detected by the second detector. For this purpose, the relationship between the light amount A detected by the first detector and the light amount B detected by the second detector is calibrated for each illumination mode, and the calibration value is reflected in dose control.

Assume that the light amount adjusting unit changes the intensity Is of the s-polarized light component of a light beam which enters the beam splitter and the intensity Ip of its p-polarized light component. To maintain the ratio between the light amount A and the light amount B, it is necessary to change the intensities Is and Ip at the same rate.

Assume that the light amount adjusting unit is formed from neutral density filters. If each neutral density filter is arranged perpendicularly to an incident light beam, it has the same property irrespective of whether the incident light is s- or p-polarized. However, as described above, if each neutral density filter is tilted with respect to an incident light beam, it has different transmittances with respect to s-polarized light and p-polarized light. The difference between the transmittances with respect to s-polarized light and p-polarized light changes for each neutral density filter, so the attenuation ratio between s-polarized light and p-polarized light changes every time the neutral density filters are switched. For this reason, the ratio (i.e., the ratio between the amount of a light beam transmitted through the beam splitter and that of a light beam reflected by the beam splitter) between the intensities of the s-polarized light component and p-polarized light component of a light beam which enters the beam splitter changes. This makes it impossible to maintain the ratio between the light amount A detected by the first detector and the light amount B detected by the second detector constant.

SUMMARY OF THE INVENTION

The present invention provides an exposure apparatus which allows high-accuracy dose control.

According to one aspect of the present invention, there is provided an exposure apparatus comprising an illumination optical system configured to illuminate a reticle with a light beam from a light source, and a projection optical system configured to project a pattern of the reticle onto a substrate, the illumination optical system including a light amount adjusting unit configured to adjust an amount of the light beam, a polarization adjusting unit configured to adjust a polarization state of the light beam, and a beam splitter configured to split the incident light beam into two light beams, wherein the light amount adjusting unit, the polarization adjusting unit, and the beam splitter are set in an order from the light source side.

According to yet another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIG. 11 is a schematic sectional view of a conventional exposure apparatus.

DESCRIPTION OF THE EMBODIMENT

A preferred embodiment of the present invention will be described below with reference to the accompanying drawings. The same reference numbers denote the same members throughout the drawings, and a repetitive description thereof will not be given.

Figure 1:
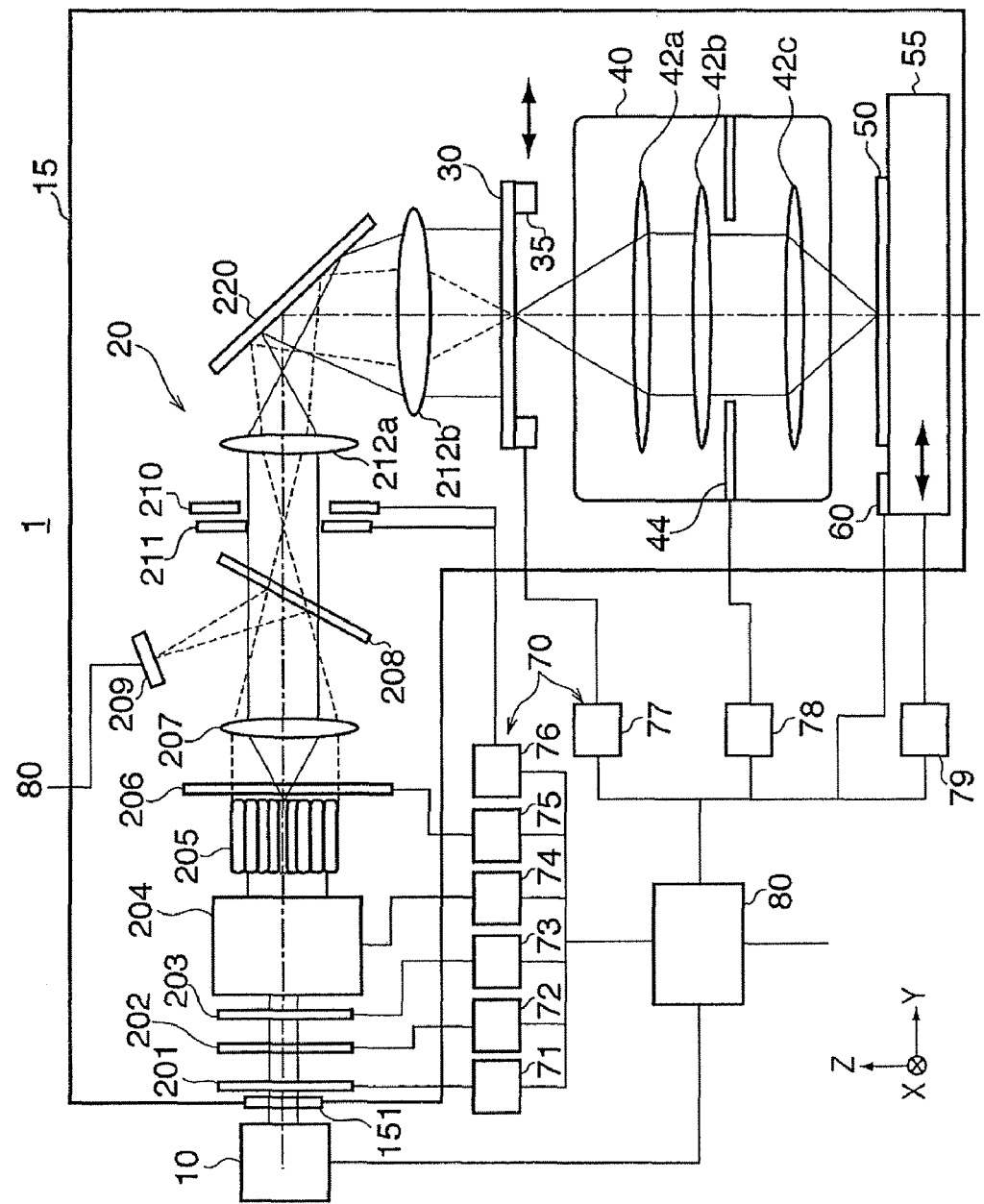
FIG. 1 is a schematic sectional view showing an exposure apparatus according to one aspect of the present invention.

FIG. 1 is a schematic sectional view showing an exposure apparatus 1 according to one aspect of the present invention. In this embodiment, the exposure apparatus 1 is a projection exposure apparatus which transfers the pattern of a reticle 30 onto a wafer 50 by exposure using the step & scan scheme (scanning exposure scheme). However, the exposure apparatus 1 can also adopt the step & repeat scheme (full-plate exposure scheme).

As shown in FIG. 1, the exposure apparatus 1 includes a light source 10, a chamber 15, an illumination optical system 20, a reticle stage 35 which supports the reticle 30, a projection optical system 40, a wafer stage 55 which supports the wafer 50, a detecting unit 60, a driving mechanism 70, and a control unit 80.

The light source 10 is, for example, an excimer laser such as a KrF excimer laser with a wavelength of about 248 nm or an ArF excimer laser with a wavelength of about 193 nm. However, the light source 10 is not particularly limited to an excimer laser, and may be, for example, an $F_2$ laser with a wavelength of about 157 nm.

Figure 2:
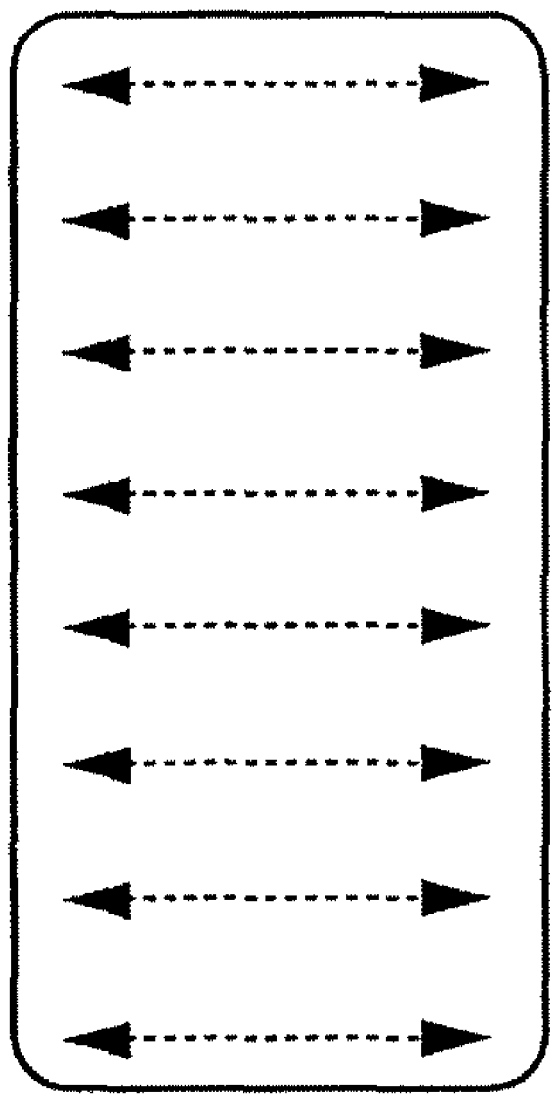
FIG. 2 is a view showing the shape and polarization state of a light beam emitted by a light source of the exposure apparatus shown in FIG. 1.

FIG. 2 shows the shape and polarization state of a light beam emitted by the light source 10. As shown in FIG. 2, the light beam emitted by the light source 10 is a nearly linearly polarized light beam which has a limited width to cope with the chromatic aberration of the projection optical system 40 and is polarized in the horizontal direction with a degree of polarization of 95% or more. At the same time, the light beam emitted by the light source 10 is a nearly collimated light beam with an angle of divergence of 19 or less on either side of the optical path. The degree of polarization is defined by $(H-V)/(H+V) \times 100$, where H is the intensity of polarized light which oscillates in the horizontal direction, and V is the intensity of polarized light which oscillates in the vertical direction.

The chamber 15 accommodates at least the illumination optical system 20 (to be described later) such that the light source 10 is isolated from the illumination optical system 20. The optical path in the chamber 15 is maintained in a vacuum, reduced-pressure, or inert gas (e.g., $N_2$ gas) atmosphere to prevent (suppress) attenuation of the light beam from the light source 10. The chamber 15 has a window part 151 which guides the light beam from the light source 10 to the illumination optical system 20. Although the window part 151 is made of a seal glass in this embodiment, it may be an opening.

In this embodiment, one chamber 15 accommodates the overall optical path (i.e., the overall optical system of the exposure apparatus 1) of the light beam from the light source 10. However, a plurality of chambers may dividedly accommodate the optical path of the light beam from the light source 10. For example, the chamber 15 may include chambers for respectively accommodating the illumination optical system 20, reticle 30, projection optical system 40, and wafer 50.

The illumination optical system 20 illuminates the reticle 30 with the light beam from the light source 10. In this embodiment, the illumination optical system 20 includes a light amount adjusting unit 201, degree of polarization adjusting unit 202, polarization direction adjusting unit 203, beam shaping optical system 204, optical integrator 205, stop 206, condenser lens 207, beam splitter 208, detecting unit 209, scan blade 210, variable slit 211, and imaging lenses 212a and 212b. Although the illumination optical system 20 includes both the degree of polarization adjusting unit 202 and polarization direction adjusting unit 203 as a polarization adjusting unit which adjusts the polarization state of a light beam in this embodiment, it may include at least one of them.

Figure 3:
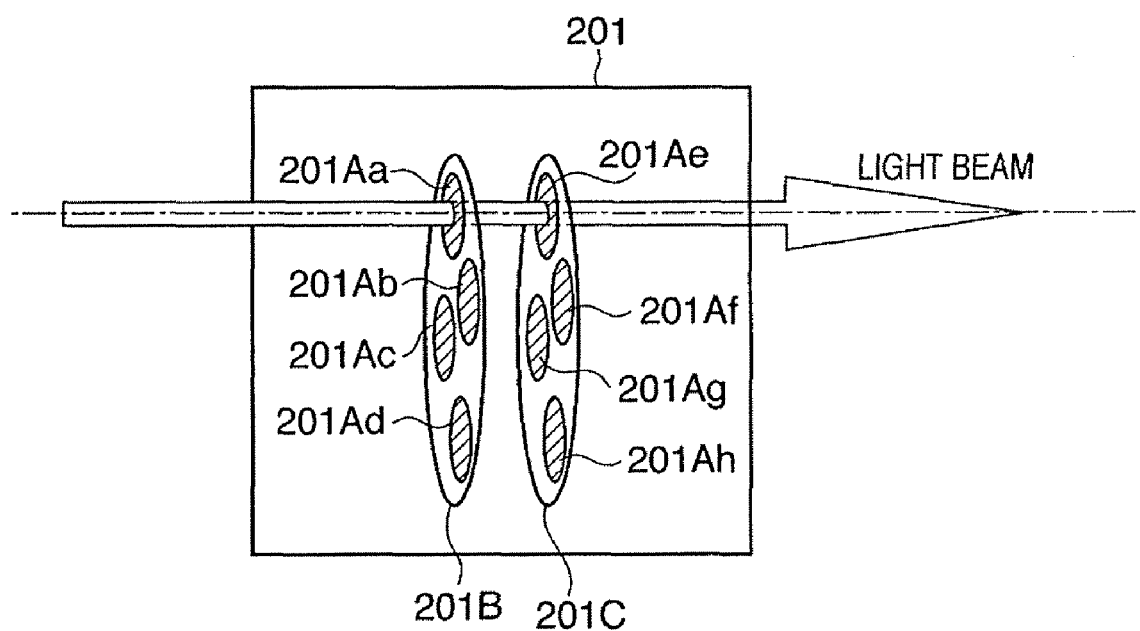
FIG. 3 is a schematic perspective view showing an arrangement example of a light amount adjusting unit of the exposure apparatus shown in FIG. 1.

The light amount adjusting unit 201 has a function of adjusting the amount of the light beam emitted by the light source 10, and is inserted between the degree of polarization adjusting unit 202 (to be described later) and the window part 151 formed in the chamber 15. For example, as shown in FIG. 3, the light amount adjusting unit 201 includes a plurality of neutral density members 201Aa to 201Ah with different transmittances, a first turret 201B, and a second turret 201C. FIG. 3 is a schematic perspective view showing an arrangement example of the light amount adjusting unit 201.

The plurality of neutral density members 201Aa to 201Ah include, for example, neutral density filters or ND filters. In this embodiment, the neutral density members 201Aa to 201Ad are arranged on the first turret 201B, while the neutral density members 201Ae to 201Ah are arranged on the second turret 201C.

The first turret 201B is driven by a first driving unit 71 (to be described later), rotatably holds the plurality of neutral density members 201Aa to 201Ad, and switchably inserts them in the optical path of the illumination optical system 20. The second turret 201C is driven by the first driving unit 71, rotatably holds the plurality of neutral density members 201Ae to 201Ah, and switchably inserts them in the optical path of the illumination optical system 20.

The light amount adjusting unit 201 obtains an optimal dose on the surface of the wafer 50 by combining one of the of neutral density members 201Aa to 201Ad and one of the neutral density members 201Ae to 201Ah. In other words, the light amount adjusting unit 201 can finely adjust the attenuation ratio (light amount) by combining one of the neutral density members 201Aa to 201Ad and one of the neutral density members 201Ae to 201Ah.

To remove any light beam reflected by the neutral density members 201Aa to 201Ah from the optical path of the illumination optical system 20, these neutral density members 201Aa to 201Ah are preferably tilted with respect to an incident light beam. More specifically, the incident surfaces of plate-like neutral density members (for example, neutral density filters) are tilted with respect to an incident light beam. In this embodiment, it is also necessary to take account of light beams reflected by the neutral density members 201Aa to 201Ad arranged on the first turret 201B, and those reflected by the neutral density members 201Ae to 201Ah arranged on the second turret 201C. For this purpose, the tilt angle of each of the neutral density members 201Aa to 201Ad arranged on the first turret 201B is preferably different from that of each of the neutral density members 201Ae to 201Ah arranged on the second turret 201C.

Figure 4:
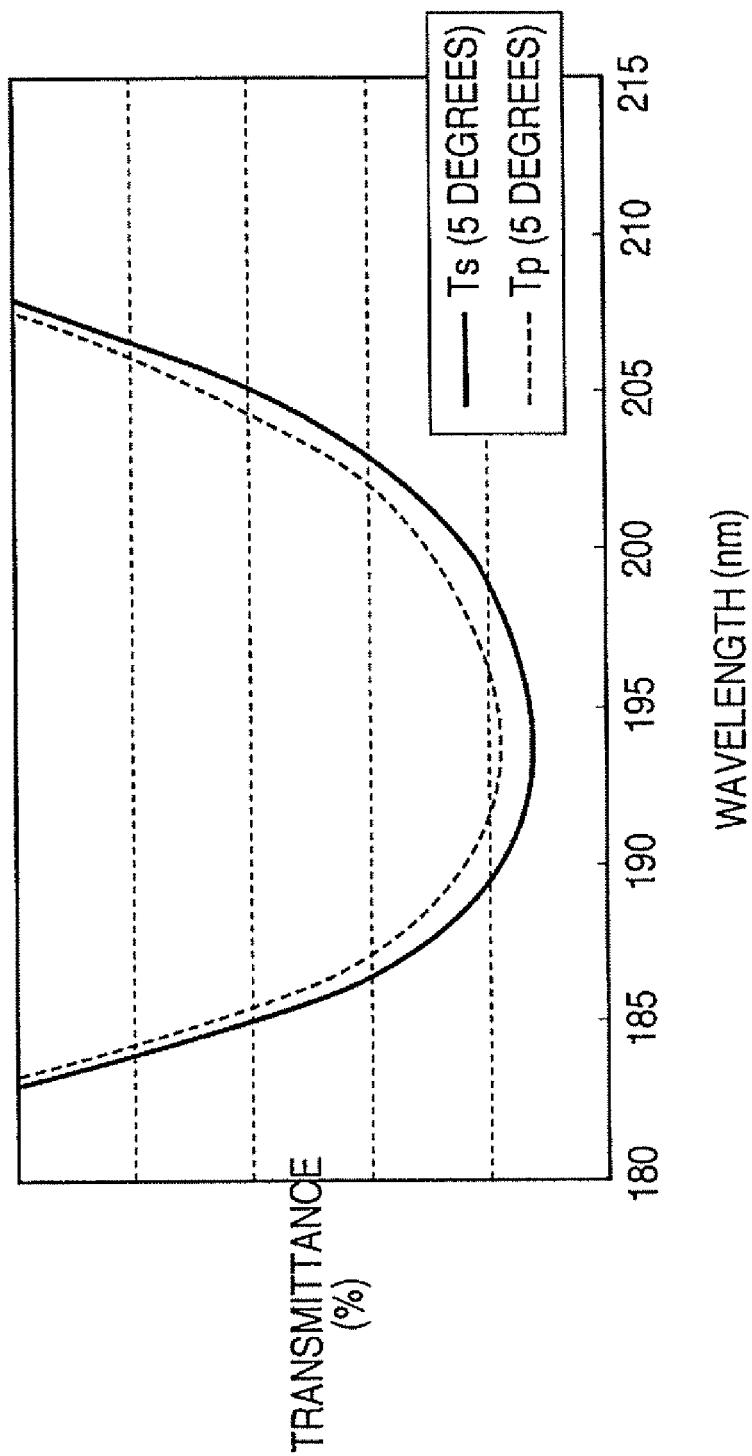
FIG. 4 is a graph showing the characteristic of a neutral density filter compatible with a light beam with a wavelength of 193 nm.

The arrangement of the light amount adjusting unit 201 will be explained by taking a case in which the neutral density members 201Aa to 201Ah are formed from neutral density filters as an example. FIG. 4 is a graph showing the characteristic of a neutral density filter compatible with a light beam with a wavelength of 193 nm. In FIG. 4, the abscissa indicates the wavelength (nm) of an incident light beam, and the ordinate indicates the transmittance (%) of the neutral density filter. FIG. 4 shows the transmittance (Ts) with respect to s-polarized light and the transmittance (Tp) with respect to p-polarized light when the incident angle is 5°.

Referring to FIG. 4, the transmittance of a general neutral density filter with respect to s-polarized light is less sensitive to the incident angle than that with respect to p-polarized light. From the viewpoint of easy fabrication and assembly, a more stable transmittance characteristic can be obtained when the neutral density filter receives s-polarized light for which it has a relatively stable transmittance over a broad incident angle range. In view of this, if the incident angle of a light beam which enters the neutral density filter is 5° or more, the neutral density filter is preferably oriented along the direction of s-polarization. If the incident angle of a light beam which enters the neutral density filter is less than 5°, the neutral density filter maintains roughly the same property irrespective of whether it is oriented along the direction of s-polarization or p-polarization.

In this embodiment, the degree of polarization adjusting unit 202 is formed from a member which adjusts the light intensity ratio between a polarized light component (for example, a p-polarized light component) in the horizontal direction and a polarized light component (for example, an s-polarized light component) in the vertical direction at 1:1. More specifically, the degree of polarization adjusting unit 202 is formed from $\lambda/4$ plate (quarter waveplate) or a wedge-shaped optical element (for example, a depolarizer) which has a birefringence and is set such that the optical path length changes depending on the propagation position. If the degree of polarization adjusting unit 202 is formed from a depolarizer, it is possible to control the polarization state of a light beam to non-polarization. If the degree of polarization adjusting unit 202 is formed from $\lambda/4$ plate, it is possible to control the polarization state of a light beam to circular polarization, elliptic polarization, and linear polarization.

The depolarizer or $\lambda/4$ plate of the degree of polarization adjusting unit 202 is driven by a second driving unit 72 (to be described later), and arranged to be insertable in and retractable from the optical path of the illumination optical system 20 and to be rotatable in a plane perpendicular to the optical axis of the illumination optical system 20. For example, the second driving unit 72 adjusts the depolarizer or $\lambda/4$ plate of the degree of polarization adjusting unit 202 at an arbitrary rotational angle so that the light intensity of a polarized light component in the horizontal direction becomes equal to that of a polarized light component in the vertical direction. This makes it possible to suppress a change in imaging performance, which depends on the direction of polarization of a light beam.

The polarization direction adjusting unit 203 is placed at the subsequent of the light amount adjusting unit 201 and, more specifically, at the subsequent of the degree of polarization adjusting unit 202. The polarization direction adjusting unit 203 has a function of adjusting the polarization state of a light beam. In this embodiment, the polarization direction adjusting unit 203 changes the oscillation direction of a light beam having passed through the degree of polarization adjusting unit 202, thereby adjusting the direction of polarization of the light beam. In other words, the polarization direction adjusting unit 203 achieves polarized illumination solely or in cooperation with the degree of polarization adjusting unit 202. In this embodiment, the polarization direction adjusting unit 203 is formed from a $\lambda/2$ plate (half waveplate). The polarization direction adjusting unit 203 need not always be formed from one $\lambda/2$ plate, and may be formed from, for example, a plurality of $\lambda/2$ plates to achieve tangential polarization.

The $\lambda/2$ plate of the polarization direction adjusting unit 203 is driven by a third driving unit 73 (to be described later), and arranged to be insertable in and retractable from the optical path of the illumination optical system 20 and to be rotatable in a plane perpendicular to the optical axis of the illumination optical system 20. With this arrangement, the polarization direction adjusting unit 203 can form a desired polarization state.

The beam shaping optical system 204 includes, for example, a plurality of optical elements and a zoom lens. The beam shaping optical system 204 is driven by a fourth driving unit 74 (to be described later), and shapes the intensity distribution and angular distribution of a light beam which enters the optical integrator 205 at the subsequent into desired distributions.

In this embodiment, the optical integrator 205 is formed by two-dimensionally arranging a plurality of microlenses. The optical integrator 205 forms a plurality of secondary sources (effective light sources) near its exit surface.

The stop 206 is inserted near the exit surface of the optical integrator 205. The stop 206 is driven by a fifth driving unit 75 (to be described later), and its aperture diameter and shape can be changed as needed.

The illumination optical system 20 can form an effective light source with an arbitrary shape in accordance with the pattern of the reticle 30 by the beam shaping optical system 204, optical integrator 205, and stop 206. The shape of an effective light source includes, for example, a normal shape, annular shape, quadrupolar shape, and dipolar shape. Note that a is a coherence factor defined by (the numerical aperture (NA) of an illumination optical system)/(the numerical aperture (NA) of a projection optical system).

The condenser lens 207 condenses light beams which emerge from the plurality of secondary sources formed near the exit surface of the optical integrator 205, and superposes them on the scan blade 210 as the irradiation target surface. In other words, the condenser lens 207 uniformly irradiates the scan blade 210.

The beam splitter 208 reflects a certain component (for example, several percent) of the light beam which emerges from the optical integrator 205 and guides it to the detecting unit 209, while it transmits the remaining component of the light beam which emerges from the optical integrator 205. In other words, the beam splitter 208 has a function of splitting an incident light beam into two light beams.

The detecting unit (first light amount detecting unit) 209 is inserted at a position optically conjugate to the surfaces of the reticle 30 and wafer 50, and detects the light amount in the illumination optical system. In other words, the detecting unit 209 serves as a detector for always detecting the exposure light amount (accumulated dose), and is formed from an illuminometer in this embodiment. The detecting unit 209 sends the detection result (i.e., the amount of the light beam component reflected by the beam splitter 208) to the control unit 80 (to be described later).

The scan blade 210 is formed from a plurality of light-shielding plates, and driven by a sixth driving unit 76 (to be described later) so as to form an opening with an arbitrary shape. The scan blade 210 has a function of limiting the exposure range on the surface of the wafer 50. The scan blade 210 is scanned by the sixth driving unit 76 in synchronism with the reticle stage 35 and wafer stage 55.

The variable slit 211 is inserted near the scan blade 210 to improve the illuminance uniformity on the exposure surface after scanning exposure. The variable slit 211 is formed from a plurality of light-shielding plates so as to obtain a uniform illuminance distribution upon dose accumulation in the scanning direction, and driven by the sixth driving unit 76.

The imaging lenses 212a and 212b form an image on the surface of the reticle 30 with the light transmitted through the opening of the scan blade 210. A deflecting mirror 220 bends the light from the imaging lens 212a, and guides it to the imaging lens 212b.

The reticle 30 has a circuit pattern and is supported and driven by the reticle stage 35. Diffracted light generated by the reticle 30 forms an image on the wafer 50 via the projection optical system 40. Since the exposure apparatus 1 is of the step & scan scheme, it transfers the pattern of the reticle 30 onto the wafer 50 by scanning them.

The reticle stage 35 supports the reticle 30 and is connected to a seventh driving unit 77 (to be described later). The reticle stage 35 is driven by the seventh driving unit 77, and can move the reticle 30 in the X direction, Y direction, and Z direction. For example, when the reduction magnification of the projection optical system 40 is $1/\beta$, and the scanning velocity of the wafer stage 55 is V (mm/sec), the scanning velocity of the reticle stage 35 is $\beta$V (mm/sec). Note that a direction perpendicular to the scanning direction of the reticle 30 or wafer 50 on its surface is defined as the X direction, the scanning direction of the reticle 30 or wafer 50 on its surface is defined as the Y direction, and a direction (the optical axis direction of the projection optical system 40) perpendicular to the surface of the reticle 30 or wafer 50 is defined as the Z direction.

The projection optical system 40 projects (reduces and projects) the pattern of the reticle 30 onto the wafer 50. The projection optical system 40 can be a dioptric system, catadioptric system, or catoptric system.

In this embodiment, the projection optical system 40 includes a plurality of lenses 42a, 42b, and 42c and an NA stop 44. Although the projection optical system 40 is formed from three lenses 42a, 42b, and 42c in FIG. 1, it is formed from a larger number of lenses in practice. The NA stop 44 has a function of limiting the pupil area of the projection optical system 40. The NA stop 44 is driven by an eighth driving unit 78 (to be described later), and its aperture diameter can be changed so as to change the NA of the projection optical system 40.

The wafer 50 is a substrate onto which the pattern of the reticle 30 is projected (transferred), and is inserted on the exposure surface (the imaging plane of the projection optical system 40). However, it is also possible to use a glass plate or other substrates in place of the wafer 50. The wafer 50 is coated with a photoresist.

The wafer stage 55 supports the wafer 50 and detecting unit 60, and is connected to a ninth driving unit 79 (to be described later). The wafer stage 55 is driven by the ninth driving unit 79, and can move the wafer 50 in the optical axis direction (Z direction) of the projection optical system 40 and two-dimensionally along a plane (X-Y plane) perpendicular to the optical axis of the projection optical system 40.

The detecting unit (second light amount detecting unit) 60 is arranged on the wafer stage 55, and detects the amount of a light beam (exposure light) which enters the surface (the imaging plane of the projection optical system) of the wafer 50. More specifically, the detecting unit 60 is arranged such that the light beam detection surface coincides with the surface of the wafer 50, and detects exposure light in the exposure region while moving in synchronism with the driving of the wafer stage 55. The detecting unit 60 sends the detection result (i.e., the amount of the light beam which enters the wafer 50) to the control unit 80 (to be described later).

The driving mechanism 70 drives constituent members of the exposure apparatus 1 under the control of the control unit 80. In this embodiment, the driving mechanism 70 includes the first driving unit 71 to ninth driving unit 79. The first driving unit 71 to ninth driving unit 79 are formed from, for example, linear motors but can take any form known to those skilled in the art, and a detailed description of their arrangements and operations will not be given herein. The first driving unit 71 drives the light amount adjusting unit 201 (the first turret 201B and second turret 201C which hold the plurality of neutral density members 201Aa to 201Ah). The second driving unit 72 drives the degree of polarization adjusting unit 202 (depolarizer or λ/4 plate). The third driving unit 73 drives the polarization direction adjusting unit 203 (λ/2 plate). The fourth driving unit 74 drives the beam shaping optical system 204 (e.g., a plurality of optical elements and zoom lens). The fifth driving unit 75 drives the stop 206. The sixth driving unit 76 drives the scan blade 210 and variable slit 211. The seventh driving unit 77 drives the reticle stage 35. The eighth driving unit 78 drives the NA stop 44. The ninth driving unit 79 drives the wafer stage 55.

The control unit 80 includes a CPU and memory (not shown) and controls the operation of the exposure apparatus 1. The control unit 80 is electrically connected to the light source 10, detecting unit 209, detecting unit 60, and driving mechanism 70 (first driving unit 71 to ninth driving unit 79). In this embodiment, the control unit 80 performs control (dose control) to expose the wafer 50 with an appropriate dose. More specifically, the control unit 80 controls the light amount adjusting unit 201 via the first driving unit 71 based on the detection results obtained by the detecting units 209 and 260.

In this manner, the light amount adjusting unit 201, degree of polarization adjusting unit 202, polarization direction adjusting unit 203, and beam splitter 208 are set in the illumination optical system 20 of the exposure apparatus 1 in an order from the light source 10 side. This makes it possible to maintain the ratio between the amount of a light beam transmitted through the beam splitter 208 and that of a light beam reflected by the beam splitter 208 constant. It is therefore possible to maintain the ratio between the light amount detected by the detecting unit 209 and the light amount detected by the detecting unit 60 constant. Hence, the exposure apparatus 1 can attain high-accuracy dose control.

The reason why the exposure apparatus 1 can achieve high-accuracy dose control will be explained in detail below. For the sake of descriptive simplicity, assume the following case. That is, the light amount adjusting unit 201 is formed from the plurality of neutral density members (neutral density filters) 201Aa to 201Ad and first turret 201B. The plurality of neutral density members 201 are tilted with respect to an incident light beam. The neutral density member 201Aa has a transmittance of 80% with respect to s-polarized light, and a transmittance of 83% with respect to p-polarized light. The neutral density member 201Ab has a transmittance of 60% with respect to s-polarized light, and a transmittance of 63% with respect to p-polarized light. The beam splitter 208 has a reflectance of 5% (i.e., a transmittance of 95%) with respect to s-polarized light, and a reflectance of 2% (i.e., a transmittance of 98%) with respect to p-polarized light.

A problem posed when a degree of polarization adjusting unit 202, light amount adjusting unit 201, and beam splitter 208 are set in an order from the light source 10 side as in a conventional exposure apparatus shown in FIG. 11 will be explained first. FIG. 11 is a schematic sectional view showing the arrangement of a conventional exposure apparatus. In the conventional exposure apparatus shown in FIG. 11, the degree of polarization adjusting unit 202 formed from a depolarizer is fixed (inserted) in the optical path of the illumination optical system 20. In other words, the conventional exposure apparatus shown in FIG. 11 has an arrangement conforming to a non-polarized illumination condition.

Referring to FIG. 11, a light beam emitted by the light source 10 is adjusted to have equal degrees of polarization in the horizontal direction and the vertical direction by the degree of polarization adjusting unit 202, and enters the light amount adjusting unit 201. Note that the ratio between the amount of transmission of s-polarized light and that of p-polarized light by the neutral density member 201Aa is 80:83, and the ratio between the amount of transmission of s-polarized light and that of p-polarized light by the neutral density member 201Ab is 60:63. As a consequence, the ratio between an intensity Is of the s-polarized light component of the light beam which enters the beam splitter 208 and an intensity Ip of its p-polarized light component differs between the neutral density members 201Aa and 201Ab. If the neutral density member 201Aa is used, the relationship (light amount $LA_1$/ light amount $LA_2$) between a light amount $LA_1$ detected by the detecting unit 60 and a light amount $LA_2$ detected by the detecting unit 209 is given by:

$$\text{(light amount } LA_1/\text{light amount } LA_2)=(0.8\times0.95+ \\ 0.83\times0.98)/(0.8\times0.05+0.83\times0.02)=27.7986 \quad (3)$$

If the neutral density member 201Ab is used, the relationship (light amount $LA_1$/light amount $LA_2$) is given by:

$$\text{(light amount } LA_1/\text{light amount } LA_2)=(0.6\times0.95+ \\ 0.63\times0.98)/(0.6\times0.05+0.63\times0.02)=27.8732 \quad (4)$$

Referring to equations (3) and (4), when the neutral density members 201Aa and 201Ab are switched in the conventional exposure apparatus, the relationship (light amount $LA_1$/light amount $LA_2$) between the light amount $LA_1$ detected by the detecting unit 60 and the light amount $LA_2$ detected by the detecting unit 209 changes by 0.27%. In other words, when the neutral density members 201Aa and 201Ab are switched in the conventional exposure apparatus, the dose control accuracy deteriorates (decreases) by 0.27%.

Figure 5:
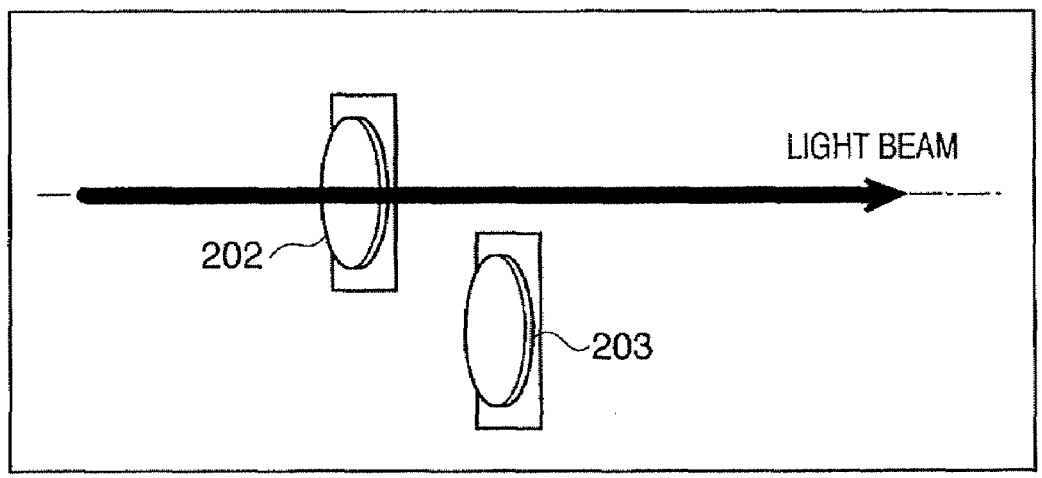
FIG. 5 is a diagram showing the positional relationship between a degree of polarization adjusting unit and a polarization direction adjusting unit under a non-polarized illumination condition in the exposure apparatus shown in FIG. 1.

The exposure apparatus 1 according to this embodiment in which the light amount adjusting unit 201, degree of polarization adjusting unit 202, polarization direction adjusting unit 203, and beam splitter 208 are set in an order from the light source 10 side will be explained next. As shown in FIG. 5, consider a case in which the exposure apparatus 1 has an arrangement conforming to a non-polarized illumination condition. Under this condition, the degree of polarization adjusting unit 202 is inserted in the optical path of the illumination optical system 20, and the polarization direction adjusting unit 203 is retracted from the optical path of the illumination optical system 20. FIG. 5 is a diagram showing the positional relationship between the degree of polarization adjusting unit 202 and the polarization direction adjusting unit 203 under a non-polarized illumination condition in the exposure apparatus 1.

Assume, for example, that a light beam having an s-polarized light component with an intensity of 96% and a p-polarized light component with an intensity of 4% enters the light amount adjusting unit 201 (neutral density member 201Aa or 201Ab). The transmittance of the light amount adjusting unit 201 with respect to s-polarized light is different from that with respect to p-polarized light. However, since the degree of polarization adjusting unit 202 is placed at the subsequent of the light amount adjusting unit 201, the relationship between the light amount $LA_1$ detected by the detecting unit 60 and the light amount $LA_2$ detected by the detecting unit 209 is always kept constant.

If the neutral density member 201Aa is used, the relationship (light amount $LA_1$/light amount $LA_2$) between the light amount $LA_1$ detected by the detecting unit 60 and the light amount $LA_2$ detected by the detecting unit 209 is given by:

$$\text{(light amount } LA_1/\text{light amount } LA_2)=\{\alpha\times(0.95+ \\ 0.98)\}/\{\alpha\times(0.05+0.02)\}=1.93/0.07=27.57143 \quad (5)$$

Note that α is $\{(0.96\times0.8)+(0.04\times0.83)\}/2$.

If the neutral density member 201Ab is used, the relationship (light amount $LA_1$/light amount $LA_2$) is given by:

$$\text{(light amount } LA_1/\text{light amount } LA_2)=\{\beta\times(0.95+ \\ 0.98)\}/\{\beta\times(0.05+0.02)\}=1.93/0.07=27.57143 \quad (6)$$

Note that β is $\{(0.96\times0.6)+(0.04\times0.63)\}/2$.

Referring to equations (5) and (6), even when the degree of polarization of a light beam emitted by the light source 10 changes, for example, from 96% to 99%, the relationship (light amount $LA_1$/light amount $LA_2$) remains the same although the α and β values change. This allows stable (high-accuracy) dose control.

Figure 6:
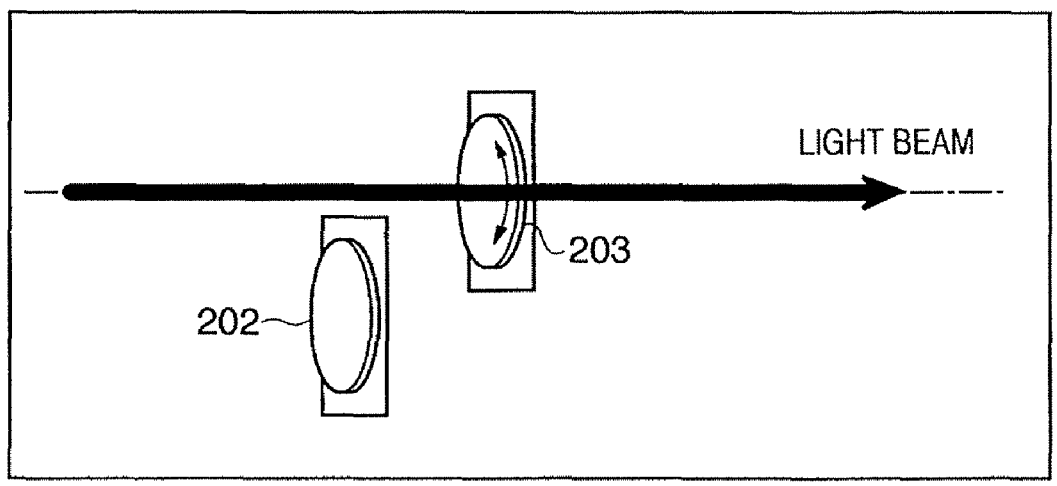
FIG. 6 is a diagram showing the positional relationship between the degree of polarization adjusting unit and the polarization direction adjusting unit under a polarized illumination condition in the exposure apparatus shown in FIG. 1.
Figure 7:
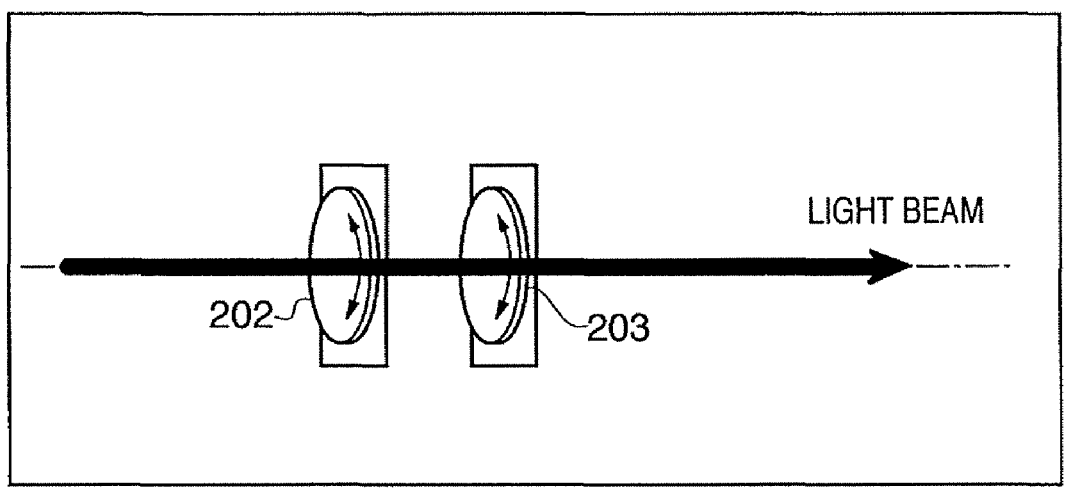
FIG. 7 is a diagram showing the positional relationship between the degree of polarization adjusting unit and the polarization direction adjusting unit under a polarized illumination condition in the exposure apparatus shown in FIG. 1.

Consider a case in which the exposure apparatus 1 is under a polarized illumination condition under which the reticle 30 is illuminated with polarized light. Assume that the degree of polarization of a light beam emitted by the light source 10 is equal to or more than a predetermined value (for example, 99%). In this case, the degree of polarization adjusting unit 202 is retracted from the optical path of the illumination optical system 20, and the polarization direction adjusting unit 203 is inserted in the optical path of the illumination optical system 20, as shown in FIG. 6. Assume that the degree of polarization of a light beam emitted by the light source 10 is less than a predetermined value (for example, 99%). In this case, both the degree of polarization adjusting unit 202 and polarization direction adjusting unit 203 are inserted in the optical path of the illumination optical system 20, as shown in FIG. 7. The degree of polarization adjusting unit 202 and polarization direction adjusting unit 203 are adjusted at desired rotational positions. FIGS. 6 and 7 are diagrams each showing the positional relationship between the degree of polarization adjusting unit 202 and the polarization direction adjusting unit 203 under a polarized illumination condition in the exposure apparatus 1.

Similar to the non-polarized illumination condition shown in FIG. 5, the relationship (light amount $LA_1$/light amount $LA_2$) between a light amount $LA_1$ detected by the detecting unit 60 and a light amount $LA_2$ detected by the detecting unit 209 is calculated. Under the polarized illumination conditions shown in FIGS. 6 and 7, if the neutral density member 201Aa is used, the relationship (light amount $LA_1$/light amount $LA_2$) is given by:

$$\text{(light amount } LA_1/\text{light amount } LA_2) = \{(0.8 \times 0.99 \times 0.95 + 0.83 \times 0.01 \times 0.98)/(0.8 \times 0.99 \times 0.05 + 0.83 \times 0.02)\} = 19.12523 \quad (7)$$

If the neutral density member 201Ab is used, the relationship (light amount $LA_1$/light amount $LA_2$) is given by:

$$\text{(light amount } LA_1/\text{light amount } LA_2) = \{(0.6 \times 0.99 \times 0.63 \times 0.01 \times 0.98)/(0.6 \times 0.99 \times 0.05 + 0.63 \times 0.02)\} = 19.12674 \quad (8)$$

Referring to equations (7) and (8), even when the neutral density members 201Aa and 201Ab are switched, the relationship (light amount $LA_1$/light amount $LA_2$) changes only by 0.008%. Since this value is negligibly low, stable (high-accuracy) dose control is possible.

Polarized illumination requires a light beam with a sufficiently high degree of polarization to improve the illumination efficiency and to maintain the dose control accuracy (the stability of the relationship (light amount $LA_1$/light amount $LA_2$)) upon switching between the neutral density members 201Aa and 201Ab. For this purpose, if a light beam emitted by the light source 10 has a relatively low degree of polarization, a polarizing beam splitter need only be inserted between the light source 10 and the degree of polarization adjusting unit 202 to extract a desired polarized light component, thereby obtaining a light beam with a sufficiently high degree of polarization.

In this manner, the light amount adjusting unit 201, degree of polarization adjusting unit 202, polarization direction adjusting unit 203, and beam splitter 208 are set in the exposure apparatus 1 in an order from the light source 10 side. Hence, the exposure apparatus 1 allows dose control with a higher accuracy than that of the conventional exposure apparatus.

Figure 8:
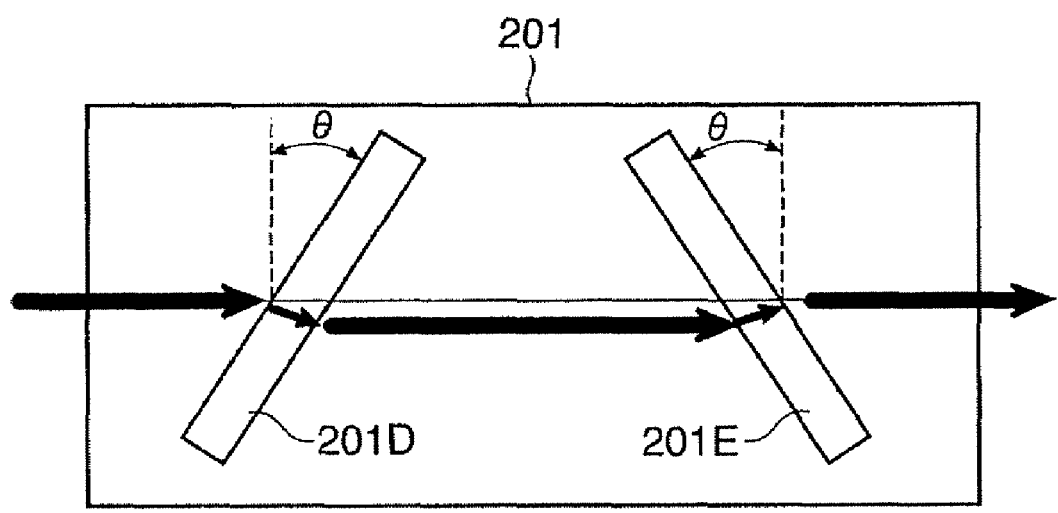
FIG. 8 is a schematic sectional view showing another arrangement example of the light amount adjusting unit of the exposure apparatus shown in FIG. 1.

The light amount adjusting unit 201 is not particularly limited to the arrangement shown in FIG. 3, and may have an arrangement shown in FIG. 8. FIG. 8 is a schematic sectional view showing another arrangement example of the light amount adjusting unit 201. The light amount adjusting unit 201 shown in FIG. 8 includes two flat-plate transparent members 201D and 201E. The flat-plate transparent members 201D and 201E are coated with transmittance control films. The transmittance of the light amount adjusting unit 201 shown in FIG. 8 can be changed by changing angles (tilt angles) θ of the flat-plate transparent members 201D and 201E with respect to an incident light beam. However, changing the tilt angle θ of the flat-plate transparent member 201D shifts the position at which a light beam passes through it. Furthermore, the positional shift amount of a light beam transmitted through the flat-plate transparent member 201D always changes depending on the tilt angle θ of the flat-plate transparent member 201D. To cope with this situation, the light amount adjusting unit 201 shown in FIG. 8 includes the flat-plate transparent member 201E. More specifically, to correct the change in positional shift of the transmitted light beam, the flat-plate transparent members 201D and 201E with the same property are made to oppose each other. The flat-plate transparent members 201D and 201E are driven at the same tilt angle in opposite directions. This makes it possible to correct the positional shift of the light beam transmitted through the flat-plate transparent member 201D.

A half mirror, for example, can be used as a beam splitter. The transmitted light amount may be detected by guiding light reflected by the beam splitter to a reticle, and guiding light transmitted through the beam splitter to a first light amount detector. In this case, a deflecting mirror (bending mirror), for example, also serves as a beam splitter. The insertion position of the deflecting mirror is not particularly limited to the position shown in FIG. 1.

Figure 9:
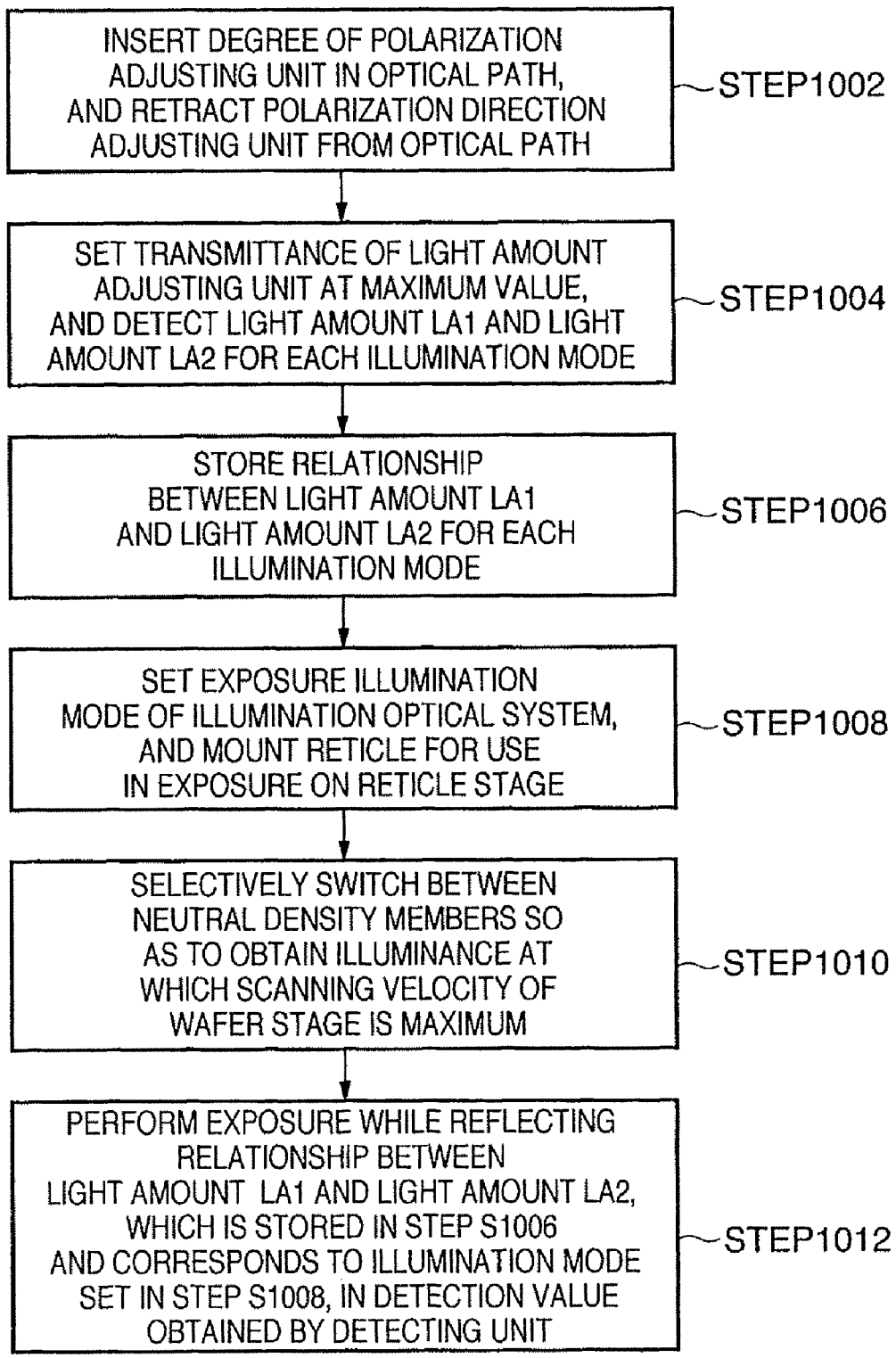
FIG. 9 is a flowchart for explaining an exposure method under a non-polarized illumination condition using the exposure apparatus shown in FIG. 1.

An exposure method using the exposure apparatus 1 will be described below. An exposure method under a non-polarized illumination condition will be explained first with reference to FIG. 9. FIG. 9 is a flowchart for explaining an exposure method under a non-polarized illumination condition using the exposure apparatus 1.

In step S1002, the degree of polarization adjusting unit 202 is inserted in the optical path of the illumination optical system 20, and the polarization direction adjusting unit 203 is retracted from the optical path of the illumination optical system 20.

In step S1004, the transmittance of the light amount adjusting unit 201 is set at a maximum value, and the light amount $LA_1$ and the light amount $LA_2$ are detected using the detecting unit 60 and the detecting unit 209 for each illumination mode. Although the transmittance of the light amount adjusting unit 201 is set at a maximum value in this embodiment, the present invention is not particularly limited to this. However, the transmittance of the light amount adjusting unit 201 is preferably set at a maximum value in consideration of the sensitivities of the detecting units 60 and 209.

In step S1006, the relationship between the light amount $LA_1$ detected by the detecting unit 60 and the light amount $LA_2$ detected by the detecting unit 209 is stored for each illumination mode. The relationship between the light amount $LA_1$ detected by the detecting unit 60 and the light amount $LA_2$ detected by the detecting unit 209 may be stored in a memory of the control unit 80 or other storage devices.

In step S1008, the exposure illumination mode of the illumination optical system 20 is set, and the reticle 30 for use in exposure is mounted on the reticle stage 35.

In step S1010, the neutral density members 201Aa to 201Ah of the light amount adjusting unit 201 are selectively switched so as to obtain the illuminance (the illuminance on the wafer surface) at which the scanning velocity of the wafer stage 55 is maximum. To improve the productivity, the exposure apparatus preferably performs exposure by maximizing the scanning velocity of the wafer stage 55 while taking account of the fact that the required dose changes depending on a device to be fabricated (process condition). In step S1010, the illuminance required for exposure by maximizing the scanning velocity of the wafer stage 55 is calculated based on the required dose. The neutral density members 201Aa to 201Ah of the light amount adjusting unit 201 are selectively inserted in the optical path of the illumination optical system 20 so as to obtain the calculated illuminance.

In step S1012, exposure is performed while reflecting the relationship between the light amount $LA_1$ and the light amount $LA_2$, which is stored in step S1006 and corresponds to the illumination mode set in step S1008, in the detection value obtained by the detecting unit 209. More specifically, in step S1012, exposure is performed with dose control so that the light amount detected by the detecting unit 209 falls within a preset allowance.

Figure 10:
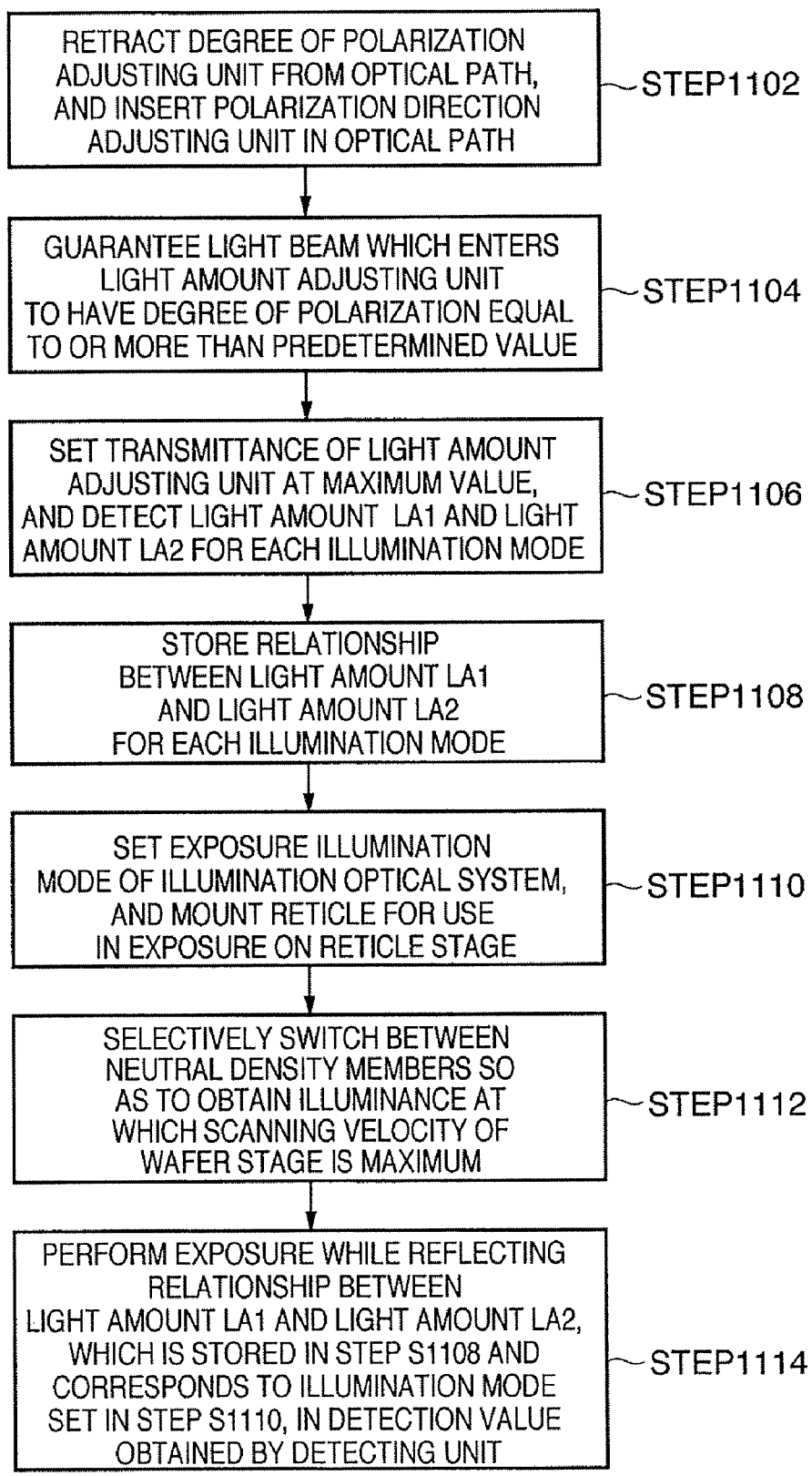
FIG. 10 is a flowchart for explaining an exposure method under a polarized illumination condition using the exposure apparatus shown in FIG. 1.

An exposure method under a polarized illumination condition will be explained next with reference to FIG. 10. FIG. 10 is a flowchart for explaining an exposure method under a polarized illumination condition using the exposure apparatus 1.

In step S1102, the degree of polarization adjusting unit 202 is retracted from the optical path of the illumination optical system 20, and the polarization direction adjusting unit 203 is inserted in the optical path of the illumination optical system 20. Instead of retracting the degree of polarization adjusting unit 202 from the optical path of the illumination optical system 20, it may be inserted in the optical path of the illumination optical system 20 at a desired rotational angle.

In step S1104, a light beam (i.e., a light beam emitted by the light source 10) which enters the light amount adjusting unit 201 is guaranteed to have a degree of polarization equal to or more than a predetermined value. Assume that the degree of polarization of the light beam which enters the light amount adjusting unit 201 is less than the predetermined value. In this case, for example, a polarizing beam splitter is inserted between the light source 10 and the light amount adjusting unit 201 so that the degree of polarization of the light beam which enters the light amount adjusting unit 201 becomes equal to or more than the predetermined value.

In step S1106, the transmittance of the light amount adjusting unit 201 is set at a maximum value, and the light amount $LA_1$ and the light amount $LA_2$ are detected using the detecting unit 60 and the detecting unit 209 for each illumination mode.

In step S1108, the relationship between the light amount $LA_1$ detected by the detecting unit 60 and the light amount $LA_2$ detected by the detecting unit 209 is stored for each illumination mode.

In step S1110, the exposure illumination mode of the illumination optical system 20 is set, and the reticle 30 for use in exposure is mounted on the reticle stage 35.

In step S1112, the neutral density members 201Aa to 201Ah of the light amount adjusting unit 201 are selectively inserted in the optical path of the illumination optical system 20 so as to obtain the illuminance (the illuminance on the wafer surface) at which the scanning velocity of the wafer stage 55 is maximum.

In step S1114, exposure is performed while reflecting the relationship between the light amount $LA_1$ and the light amount $LA_2$, which is stored in step S1106 and corresponds to the illumination mode set in step S1108, in the detection value obtained by the detecting unit 209.

In the exposure in steps S1012 and S1114, a light beam emitted by the light source 10 illuminates the reticle 30 via the illumination optical system 20. The pattern of the reticle 30 is imaged on the wafer 50 via the projection optical system 40. Since the exposure apparatus 1 achieves high-accuracy dose control as described above, it can provide devices (e.g., a semiconductor device, an LCD device, an image sensing device (e.g., a CCD), and a thin-film magnetic head) with high throughput and high quality.

A description will be given of an embodiment of a device fabrication method using the above mentioned exposure apparatus 1. The device is fabricated by a step of exposing a substrate coated with a resist (wafer or glass plate) using the exposure apparatus 1, a step of performing a development process for the substrate exposed, and a step of performing other well-known processes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-112290 filed on Apr. 20, 2007, which is hereby incorporated by reference herein in its entirely.

What is claimed is:

1. An exposure apparatus comprising:
an illumination optical system configured to illuminate a reticle with a light beam from a light source; and
a projection optical system configured to project a pattern of the reticle onto a substrate,
said illumination optical system including a light amount adjusting unit configured to adjust an amount of the light beam, a polarization adjusting unit configured to adjust a polarization state of the light beam, and a beam splitter configured to split the incident light beam into a plurality of light beams,
wherein said exposure apparatus further comprises:
a first light amount detecting unit configured to detect an amount of one of the light beams split by said beam splitter;
a second light amount detecting unit configured to detect an amount of the light beam on an imaging plane of said projection optical system; and
a control unit configured to control a dose in exposure of the substrate using the detection results obtained by said first light amount detecting unit and said second light amount detecting unit,
wherein said light amount adjusting unit, said polarization adjusting unit, and said beam splitter are set in an order from the light source side,
wherein said light amount adjusting unit includes a plurality of neutral density filters with different transmittances, and a switching unit configured to switchably insert one or more of said plurality of neutral density filters in an optical path of said illumination optical system,
wherein the light source emits a linearly polarized light beam, and
wherein said one or more neutral density filters are tilt with respect to an optical axis of said illumination optical system so that the linearly polarized light beam enters said one or more neutral density filters as s-polarized light or p-polarized light, wherein said illumination optical system includes a depolarizer arranged to be insertable in and retractable from an optical path of said illumination optical system in only said polarization adjusting unit, and wherein when the depolarizer is inserted in the optical path of said illumination optical system, said control unit controls the dose in exposure of the substrate while exposing the substrate with a non-polarized illumination.

2. The apparatus according to claim 1, further comprising:

a chamber configured to accommodate at least said illumination optical system such that the light source is isolated from said illumination optical system; and a window part which is formed in said chamber and configured to guide the light beam from the light source to said illumination optical system, wherein said light amount adjusting unit is inserted between said window part and said polarization adjusting unit.

3. The apparatus according to claim 2, wherein said window part is a seal glass or an opening.

4. The apparatus according to claim 1, wherein said polarization adjusting unit includes at least one of a degree of polarization adjusting unit configured to adjust a degree of polarization of the light beam, and a polarization direction adjusting unit configured to adjust a direction of polarization of the light beam.

5. The apparatus according to claim 1, further comprising a driving unit that drives said polarization adjusting unit inserted in and retracted from the optical path of said illumination optical system.

6. The apparatus according to claim 4, wherein said degree of polarization adjusting unit includes a quarter waveplate.

7. The apparatus according to claim 1, wherein the light source emits a light beam with a linearly polarized light component of 90% or more as the linear polarized light beam.

8. A device fabrication method comprising steps of:

exposing a substrate using an exposure apparatus according to claim 1; and performing a development process for the substrate exposed.

9. The apparatus according to claim 1, wherein if an incident angle of the light enters a neutral density filter of the plurality of neutral density filters is 5° or more, the neutral density filter orients along a direction of s-polarization.

10. The apparatus according to claim 1, wherein the plurality of neutral density filters have a transmittance with respect to p-polarized light and a transmittance with respect to s-polarized light, which are different from each other, respectively.

11. The apparatus according to claim 1, wherein each of said first light amount detecting unit and said second light amount detecting unit detects the light amount for each illumination mode in a state where a neutral density filter with the maximum transmittance among said plurality of neutral density filters is inserted in the optical path of said illumination optical system, and wherein control unit controls the dose in exposure of the substrate based for each illumination mode based on the detection results obtained by said first light amount detecting unit and said second light amount detecting unit for each illumination mode.

12. The apparatus according to claim 1, wherein when the substrate is exposed with a polarized illumination, a polarization member is inserted between said light source unit and said light mount adjusting unit so that a degree of polarization of a light beam which enters said light amount adjusting unit becomes equal to or more than a predetermined value, and said control unit controls the dose in exposure of the substrate while exposing the substrate with the polarized illumination.

* * * * *